United States Patent
Choi et al.

(10) Patent No.: US 11,063,198 B2
(45) Date of Patent: Jul. 13, 2021

(54) METALLIC JUNCTION THERMOELECTRIC GENERATOR

(71) Applicant: U.S.A. as represented by the Administrator of the National Aeronautics and Space Administration, Washington, DC (US)

(72) Inventors: Sang H. Choi, Poquoson, VA (US);
Hyun Jung Kim, Poquoson, VA (US);
Adam J. Duzik, Yorktown, VA (US);
Cheol Park, Yorktown, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 216 days.

(21) Appl. No.: 15/479,679

(22) Filed: Apr. 5, 2017

(65) Prior Publication Data
US 2017/0288113 A1 Oct. 5, 2017

Related U.S. Application Data

(60) Provisional application No. 62/455,743, filed on Feb. 7, 2017, provisional application No. 62/318,311, filed on Apr. 5, 2016.

(51) Int. Cl.
*H01L 35/20* (2006.01)
*H01L 35/32* (2006.01)
*H01L 35/34* (2006.01)

(52) U.S. Cl.
CPC .............. *H01L 35/20* (2013.01); *H01L 35/32* (2013.01); *H01L 35/34* (2013.01)

(58) Field of Classification Search
CPC ......... H01L 35/12; H01L 35/20; H01L 35/30; H01L 35/32; H01L 35/34; H01L 35/325
See application file for complete search history.

(56) References Cited

U.S. PATENT DOCUMENTS

| 4,497,973 | A | * | 2/1985 | Heath | ..................... H01L 35/32 |
| | | | | | 136/205 |
| 6,075,199 | A | * | 6/2000 | Wong | ..................... H01L 35/00 |
| | | | | | 136/201 |

(Continued)

OTHER PUBLICATIONS

Narducci, D., "Do we really need high thermoelectric of merit? A critical appraisal to the power conversion efficiency of thermoelectric materials," Appl. Phys. Lett., 2011, pp. 17-20, 99(10).

(Continued)

*Primary Examiner* — Daniel P Malley, Jr.
(74) *Attorney, Agent, or Firm* — Shawn P. Gorman; Jonathan B. Soike; Helen M. Galus

(57) ABSTRACT

A metal junction thermoelectric device includes at least one thermoelectric element. The thermoelectric element has first and second opposite sides, and a first conductor made from a first metal, and a second conductor made from a second metal. The first and second conductors are electrically interconnected in series, and the first and second conductors are arranged to conduct heat in parallel between the first and second sides. The first metal has a first occupancy state, and the second metal has a second occupancy state that is lower than the first occupancy state. A temperature difference between the first and second sides of the thermoelectric element causes a charge potential due to the difference in occupancy states of the first and second metals. The charge potential generates electrical power.

11 Claims, 7 Drawing Sheets

(56) References Cited

U.S. PATENT DOCUMENTS

| | | | |
|---|---|---|---|
| 10,269,463 B2 | 4/2019 | Choi et al. | |
| 2007/0125413 A1* | 6/2007 | Olsen | H01L 35/08 136/205 |
| 2008/0272680 A1 | 11/2008 | Perreault | |
| 2013/0125963 A1 | 5/2013 | Binderbauer et al. | |
| 2015/0188019 A1* | 7/2015 | Corrado | H01L 35/32 136/206 |
| 2017/0288113 A1 | 10/2017 | Choi et al. | |
| 2018/0350481 A1 | 12/2018 | Choi et al. | |

OTHER PUBLICATIONS

Stordeur, M. et al., "Low power thermoelectric generator—self-sufficient energy supply for micro systems," 16th Int. Conf. Thermoelectr., 1997, pp. 575-577.

National Aeronautics and Space Administration., "Radioisotope power systems: radioisotope thermoelectric generator (RTG)," 2013, <https://solarsystem.nasa.gov/rps/rtg.cfm>(Jan. 6, 2017 ).

Koelle, D. et al., "Development and transportation costs of space launch systems," Proc. DGLR/CEAS Eur. Air Sp. Conf. (2007).

Swanson, R.M., "A proposed thermophotovoltaic solar energy conversion systems," Proc. IEEE, 1979, pp. 446-447, 67(3).

Schock, A. at al., "Design, analysis, and optimization of a radio-isotope thermophotovoltaic (RTPV) generator, and its applicability to an illustrative space mission," Acta Astronaut. 37(C), 1995, pp. 21-57.

Ferrari, C. et al., "Overview and status of thermophotovoltaic systems," Energy Procedia 45, 2014, pp. 160-169.

Bermel, P. et al., "Design and global optimization of high-efficiency thermophotovoltaic systems.," Opt. Express 18 Suppl, 2010, pp. A314-A334, 3(103).

Nelson, R. E., "A brief history of thermophotovoltaic," Semicond. Sci. Technol. 2003, pp. S141-S143, 18.

Crowley, C. J. et al., "Thermophotovoltaic converter performance for radioisotope power systems," AIP Conf. Proc. 2005, 746, pp. 601-614.

Coutts, T. J. "Overview of thermophotovoltaic generation of electricity," Sol. Energy Mater. Sol. Cells, 2001, pp. 443-452, 66(1-4).

Murray, C. S. et al., "Thermophotovoltaic converter design for radioisotope power systems," AIP Conf. Proc. Thermophotovoltaic Caner. Electr. 6th Conf., 2004, 123-132.

Molesky, S. et al., "Ideal near-field thermophotovoltaic cells," Phys. Rev. B, 2015, pp. 1-7, 91(20).

Sulima, O.V. et al., "Fabrication and simulation of GaSb thermophotovoltaic cells," Sol. Energy.Mater. Sol. Cells, 2001, pp. 533-540, 66(1-4).

Coutts, T. J., "Review of progress in thermophotovoltaic generation of electricity," Renew. Sustain. energy Rev. 1999, pp. 77-184, 3(2).

Shakouri, A., "Thermoelectric , thermionic and thermophotovoltaic energy conversion J Q ( r ) q Report Documentation Page", 2005, pp. 1-6.

Rosaire, C. G. et al., "Radioisotope thermophotovoitaic batteries for universal low power systems," Nucl. Emerg. Technol. Space, NETS, 2013, pp. 419-427.

Cheetham, K. J. et al., "Low bandgap GaInAsSbP pentanary thermophotovoltaic diodes," Sol. Energy Mater. Sol. Cells, 2011, pp. 534-537, 95(2).

Nagpal, P. et al., "Efficient low-temperature thermophotovoltaic emitters from metallic photonic crystals," Nano Lett., 2008, pp. 3238-3243, 8(10).

Durisch, W. et al., "Novel thin film thermophotovoltaic system," Sol. Energy Mater. Sol. Cells, 2010, pp. 960-965, 94(6).

Schock, A. et al., "Design and integration of small RTPV generators with new millennium spacecraft for outer soar system," Acta Astronaut, 1997, pp. 801-816, 41(12).

Gerstenmaier, Y. C. et al., "Efficiency of thermionic and thermoelectric converters," AIP Conf. Proc., 2007, pp. 37-45, 890.

Oman, H. "Deep space travel energy sources," IEEE Aerosp. Electron. Syst. Mag., 2003, 18(2), pp. 28-35.

Humphrey, T. E. et al., "Power optimization in thermionic devices," J. Phys. D. Appl. Phys., 2005, pp. 2051-2054 38(12).

Trucchi, D. M. et al., "Thermionic Emission A Different Path to Solar Thermal Electricity," SolarPaces Conf. (2012).

Schwede, J. W. et al., "Photon-enhanced thermionic emission for solar concentrator systems," Nat Mater., 2010, pp. 762-767, 9(9),Nature Publishing Group.

Adams, S. F., "Solar thermionic space power technology testing: A historical perspective," AIP Conf. Proc., 2006, pp. 590-597, 813.

Ha, C. T. et al., "Advanced stirling radioisotope generator: Design processes, reliability analyses impacts, and extended operation tests," AIP Conf. Proc., 2008, pp. 458-465, 969.

Chan, J. et al., "Development of advanced Stirling Radioisotope Generator for space exploration," AIP Conf. Proc. , May 2007, pp. 615-623, 880.

Wong, W. A. et al., "Advanced Sliding convertor ( ASC )—from technology development to future flight product," 2008, pp. 1-26.

Cockfield, R. D. et al., "Stirling radioisotope generator for mars surface and deep space missions," 2002 37th Intersoc. Energy Convers. Eng. Conf., 2002, pp. 134-139.

Shaltens, R. K. et al., "Advanced Stirling technology development at NASA Glenn Research Center," NASA Sci. Technol. Conf.(Sep. 2007).

Oriti, S. M., "Advanced Stirling Radioisotope Generator Engineering Unit 2 ( ASRG EU2 ) final assembiy" (2015).

Mason., L. S. et al., "Modular stirling radioisotope generator," 13th Int. Energy Convers. Eng. Conf., 2015, 3809.

Chan, T. S., "System-level testing of the advanced Stirling radioisotope generator engineering hardware," 12th Int. Energy Covers. Eng. Conf. (2014).

Chan, J. et al., "Advanced stirling radioisotope generator emergency heat dump test for nuclear safety consideration," 9th Annu. Int. Energy Covers. Eng. Conf. IECEC 2011 (2011).

Leonov, V et al., "Wearable thermoelectric generators for body-powered devices," J. Electron Mater., 2009, pp. 1491-1498, 38(7).

Leonov, V et al., "Thermoelectric and hybrid generators in wearable devices and clothes," Proc.—6th Int. Work. Wearable Implant. Body Sens. Networks, 2009, pp. 95-200.

Wang Z. L et al., "Realization of a wearable miniaturized thermoelectric generator for human body applications," Sensors Actuators, A Phys. 2009, pp. 95-102, 156(1).

Leonov, V, "Thermoelectric energy harvesting of human body heat for wearable sensors," IEEE Sens. J., 2013, pp. 2284-2291, 13(6).

Kim, M. K. et al., "Wearable thermoelectric generator for human clothing applications," 2013 Transducers Eurosensors XXVII 17th Int. Conf. Solid-State Sensors, Actuators Microsystems(Jun. 2013), pp. 1376-1379.

He, W. et al., "Recent development and application of thermoelectric generator and cooler," Appl Energy, 2015, pp. 1-25, 143.

Bahk, J. H. et al., "Flexible thermoelectric materials and device optimization for wearable energy harvesting," J. Mater. Chem. C 3, 2015, pp. 10362-10374.

Sebald, G. et al., "On thermoelectric and pyroelectric energy harvesting," Smart Mater. Struct. 2009,18(12), p. 25006, pp. 1-7.

Miotla, D., "Assessment of plutonium-238 production alternatives," Apr. 21, 2008 (available at http://energy.gov/sites/prod/files/NEGTN0NEAC_PU-238-042108.pdf), downloaded on Oct. 4, 2018.

National Aeronautics and Space Administration., "What is plutonium-238?," <https://solarsystem.nasa.gov/rps/docs/APP RPS Pu-238 FS 12-10-12.pdf> (Jan. 25, 2016 ), downloaded on Oct. 4, 2018.

Howe, S. D. et al., "Economical production of Pu-238," Nucl. Emerg. Technol. Sp. (NETS 2013) 2013, pp. 1-12, 238.

Wall, M., "Full-Scale Production of Plutonium Spacecraft Fuel Still Years Away," Space.com, May 17, 2016, (available at http://www.space.com/32890-nuclear-fuel-spacecraft-production-plutonium-238.html), downloaded on Oct. 4, 2018.

Griggs, M. B., "Plutonium-238 is produced in America for the first time in almost 30 Years," Pop. Sci., Dec. 23, 2015 (available at http://www.popsci.com/plutonium-238-is-produced-in-america-for-first-time-in-30-years), downloaded on Oct. 4, 2018.

(56) References Cited

OTHER PUBLICATIONS

Szondy, D., "US restarts production of plutonium-238 to power space missions," New Atlas, Dec. 23, 2015 (available at http://newatlas.com/ornl-plutonium-238-production-space/41041/), downloaded on Oct. 4, 2018.
L. Popa-Simil, I.L. Popa-Simil, "Nano Hatero Nuclear Fuel Structure," NSTI-Nanotech, 2007, vol. 1, LAVM LLC, Los Alamos, NM 87544, pp. 344-347.

* cited by examiner

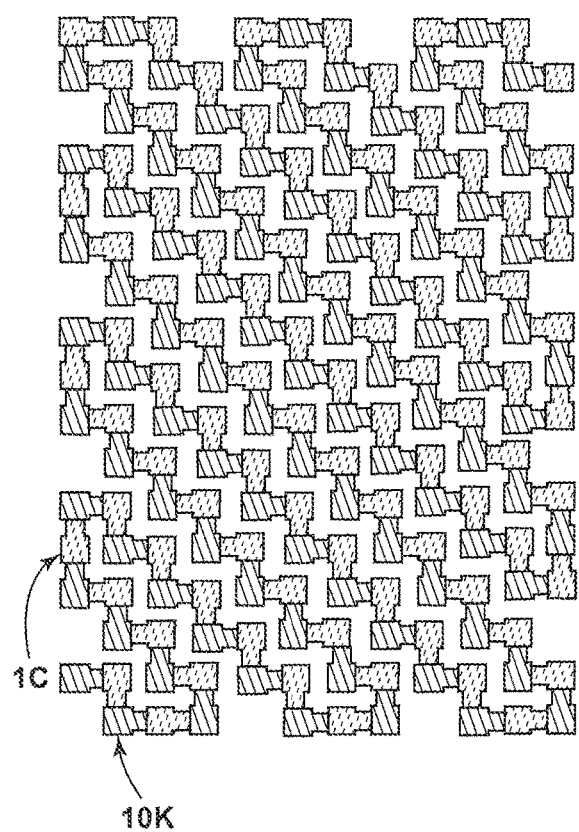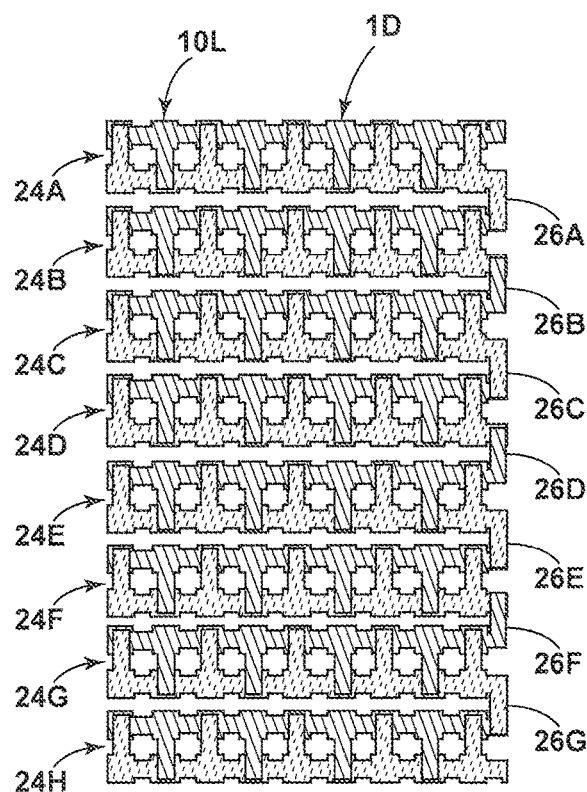
FIG. 4A
FIG. 4B

METALLIC JUNCTION THERMOELECTRIC GENERATOR

CROSS-REFERENCE TO RELATED PATENT APPLICATION

This patent application claims the benefit of and priority to U.S. Provisional Application No. 62/318,311, filed on Apr. 5, 2016, titled "METALLIC JUNCTION THERMOELECTRIC GENERATOR," and U.S. Provisional Application No. 62/455,743, filed on Feb. 7, 2017, titled "METALLIC JUNCTION THERMOELECTRIC GENERATOR," the entire contents of both provisional patent applications are hereby incorporated by reference in their entireties.

STATEMENT REGARDING FEDERALLY SPONSORED RESEARCH OR DEVELOPMENT

The invention described herein was made in the performance of work under a NASA contract and by employees of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Various types of thermoelectric devices have been developed. Existing thermoelectric devices may utilize the Seebeck effect, the Peltier effect, and the Thomson effect. Thermoelectric devices offer various advantages such as no moving parts, and the ability to provide cooling utilizing the Peltier effect.

In general, known thermoelectric devices provide an efficiency that is determined by a dimensionless figure of merit:

$$ZT = \frac{\sigma S^2}{\kappa} T \qquad (1.0)$$

wherein:
S=Seebeck coefficient
σ=electrical conductivity
K=thermal conductivity
T=temperature The efficiency (ε) of a TE device for electricity generation is given by:

$$\varepsilon = \frac{T_H - T_C}{T_H} \frac{\sqrt{1+ZT} - 1}{\sqrt{1+ZT} + \frac{T_C}{T_H}} \qquad (2.0)$$

Commercially available Peltier coolers may utilize bulk n-$Bi_2Te_3$ and p-$Sb_2Te_3$. High temperature applications may utilize bulk $Si_{1-x}Ge_x$ (x~0.2 to 0.3).

However, conflicting materials requirements may limit the efficiency of known thermoelectric devices. The Seebeck coefficient (S) for a semiconductor (valence compound) is given by:

$$S = \frac{8\pi^2 \kappa_\beta^2}{3eh^2} m^* T \left(\frac{\pi}{3n}\right)^{\frac{2}{3}} \qquad (3.0)$$

The Seebeck coefficient can be increased if the material has a small number of electrons, n, and/or a large effective mass, m*, as we see in equation (3.0). However, the electrical conductivity, a, requires large n, high charge mobility, p, and low effective mass, m*.

For metal:

$$\sigma = ne\mu \qquad (4.0)$$

For thermal conductivity, κ, there are two parts contributed by energetic electron ($\kappa_e$) and phonon transmission ($\kappa_{ph}$).

$$\kappa = \kappa_{ph} + \kappa_e \qquad (5.0)$$

where $\kappa_e = L\sigma T$. Therefore, it is written by $$\kappa = \kappa_{ph} + LTne\mu \qquad (6.0)$$

where L is the Lorentz number.

To enhance the overall performance of a thermoelectric (TE) device, it is necessary to have small $\kappa_{ph}$ small n as indicated in Equation (1). On the other hand, small thermal conductivity signifies that the energy input or flow into the TE domain must be controversially lowered. This means that increasing TE performance requires lower energy input into a TE device. It does not make sense at all that the highest TE performance requires the lowest energy conversion rate.

The conflicting materials requirements (above) for semiconductor thermoelectric devices has limited the efficiencies achieved by such devices.

Due to the drawbacks of conventional thermoelectric devices, an improved thermoelectric device would be advantageous.

BRIEF SUMMARY OF THE INVENTION

One aspect of the present invention is a metal junction thermoelectric device including at least one thermoelectric element that may be interfaced with one or more additional thermoelectric elements. The thermoelectric element has first and second opposite sides, and a first conductor made from a first non-doped metal, and a second conductor made from a second non-doped metal. The first and second conductors are electrically interconnected in series to form an interface, and the first and second conductors are arranged to conduct heat in parallel between the first and second sides. The first metal has a first occupancy state, and the second metal has a second occupancy state that is lower than the first occupancy state. This discrepancy (difference) in occupancy states of the first and second metals develops an electrical charge potential gradient between the interface of the first and second metals. Due to the difference in occupancy states of the first and second metals, a temperature difference between the first and second sides of the thermoelectric element causes a charge potential whereby the thermoelectric element generates electrical power.

Another aspect of the present invention is a method of fabricating a metal junction thermoelectric device. The method includes depositing a first metal having a first occupancy state onto a substrate to form a first conductor. The method further includes depositing a second metal having a second occupancy state onto a substrate to form a second conductor. The first and second conductors are thermally parallel to one another. The method further includes electrically interconnecting the first and second conductors to form a thermoelectric element having a metal junction such that the thermoelectric element produces a voltage potential if thermal energy is applied to the thermoelectric element.

A plurality of the metal junction thermoelectric elements may be connected in parallel, in series, or in a mixed mode including both parallel and serial connections. A plurality of the metal junction thermoelectric elements may optionally be arranged to form a multi-layer device including a plurality of metal junction thermoelectric elements in each layer. Each layer may include metal junction thermoelectric elements connected in parallel, in serial, or in both parallel and serial modes (i.e. mixed mode).

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

FIG. 4A is a schematic plan view showing a plurality of thermoelectric elements arranged to form serial mode connections;

FIG. 4B is a schematic plan view showing a plurality of thermoelectric elements arranged to form a mixed mode connection whereby groups of thermoelectric elements are connected in parallel, and the groups are connected in a serial mode;

DETAILED DESCRIPTION OF THE INVENTION

Figure 1:
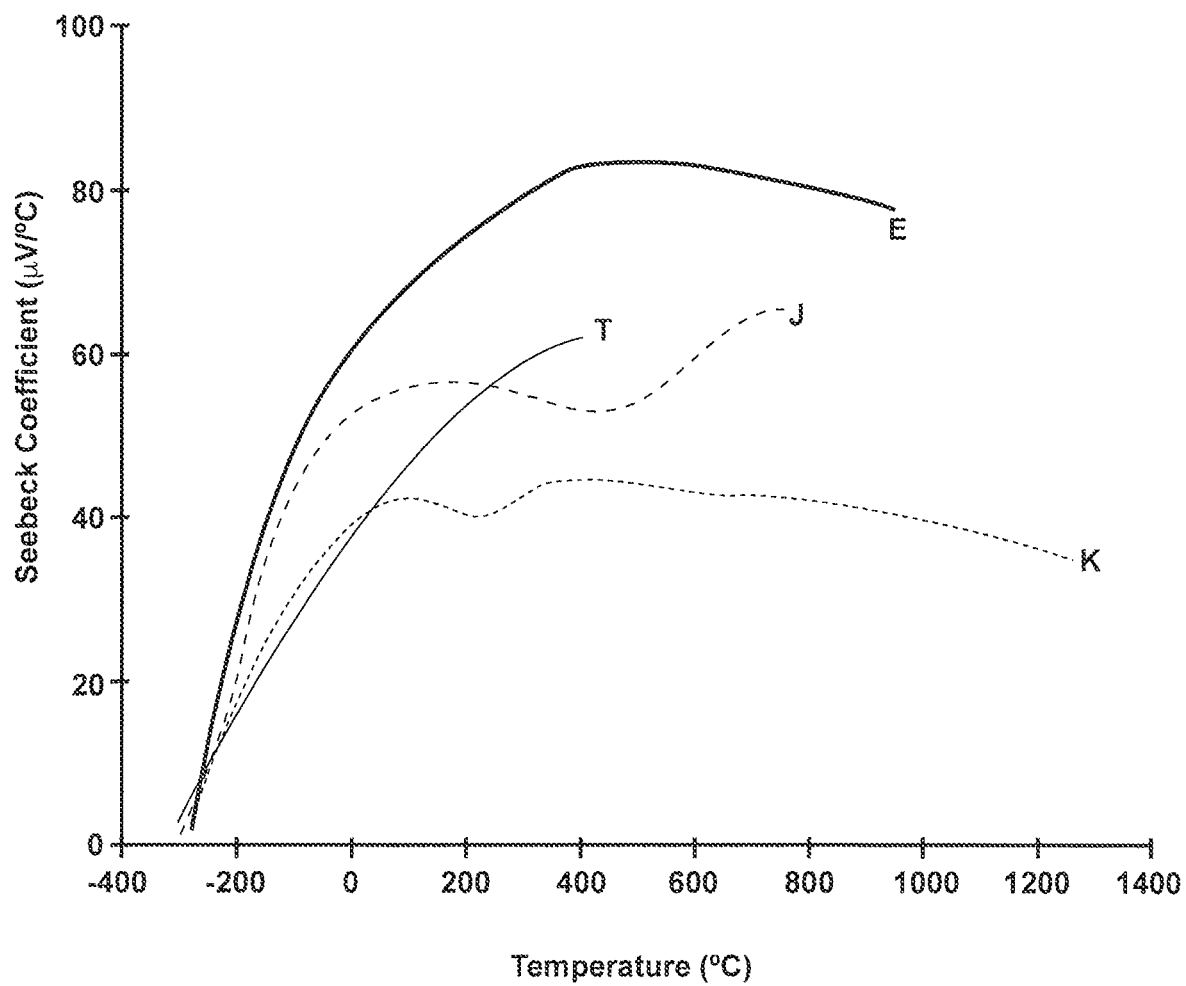
FIG. 1 is a graph showing Seebeck coefficients of various thermocouples.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The conventional concept and model of thermoelectricity has been developed on the basis of thermally agitated electrons within materials that can be used for the direct conversion of temperature differences to electric voltage and vice versa. However, high efficiency energy conversion to useful energy is still a daunting challenge. Known semiconductor-based thermoelectrics (TE) are typically only about 7~10% efficient. The efficiency of conventional TE is limited by at least two factors. First, there is a limited available pool of electrons in semiconductor junctions. This performance limitation of conventional semiconductor-based TE devices comes from fundamental limitations in the potential well that is intrinsically determined by the population of doping materials. The dopant is necessary to create a potential disparity to guide electrons through the power conversion circuit. Another limitation of semiconductor-based TE devices is the use of materials having increased thermal resistance in order to increase the figure of merit. In practice, development of semiconductor-based TE materials tends to focus on lowering thermal conductivity to increase the figure of merit. However, this also lowers the overall energy flow through a conventional semiconductor-based TE system. This results in devices with relatively low power density. A metal junction thermoelectric element according to the present disclosure alleviates or avoids these two limitations of conventional semiconductor-based devices.

The present disclosure relates to a new thermoelectric device and process based on metal-metal junctions providing substantially increased thermoelectric efficiency and power density. The metal-metal junctions may comprise layers that are fabricated using thin film deposition processes. As discussed in more detail below, a thermoelectric electric device according to the present disclosure may include a plurality of individual thermoelectric elements. Each thermoelectric element may include two metals having different vacancy states selected for the greatest possible disparity in a metal-metal junction. This type of metal-metal junction allows the greatest number of charges across the junction barrier due to the charge disparity. In general, metals have higher electron pools (e.g. greater than about $10^3$-$10^4$ C/cm) than semiconductors, and the metal junctions can therefore be made smaller and more energy compact.

A thermoelectric device according to the present disclosure is fundamentally different from conventional semiconductor-based thermoelectric devices. First, a thermoelectric device according to the present disclosure does not use any p-n junctions. Conventional TE devices that utilize p-n junctions are limited by the Brillouin limit due to the antisotropic electron plasma at the interface between n- and p-type materials. The p-n junction intrinsically limits the availability pool of the electrons that are otherwise used through the conversion circuit. The electron availability pool is typically proportional to the dopant densities of n-type and p-type in conventional thermoelectric materials. In contrast, a thermoelectric device according to the present disclosure utilizes a metallic junction as a base of energy conversion unit. The metals for metallic junction devices according to the present disclosure include elements with partially filled d-subshell and f-subshell structures. A coupled pair of any two of these elements (which have a wide potential disparity at their junction) preferably also have high electrical conductivity.

Also, a thermoelectric device according to the present disclosure does not require reducing thermal conductivity of materials by adjusting the morphological order of thermoelectric materials, which eventually causes a choking effect on thermal energy input into the system domain. Although the output of a conventional thermoelectric device is not linearly coupled to the input through system parameters, the input and output are nevertheless correlated in a responsive manner.

Figure 4C:
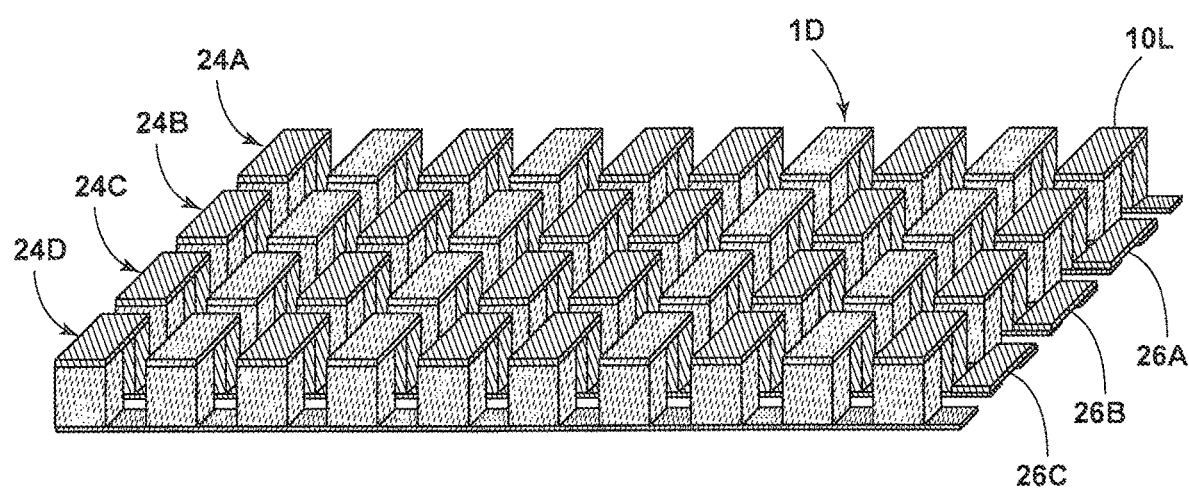
FIG. 4C is a partially schematic isometric view showing a plurality of thermoelectric elements that are arranged in a mixed mode connection.
Figure 4D:
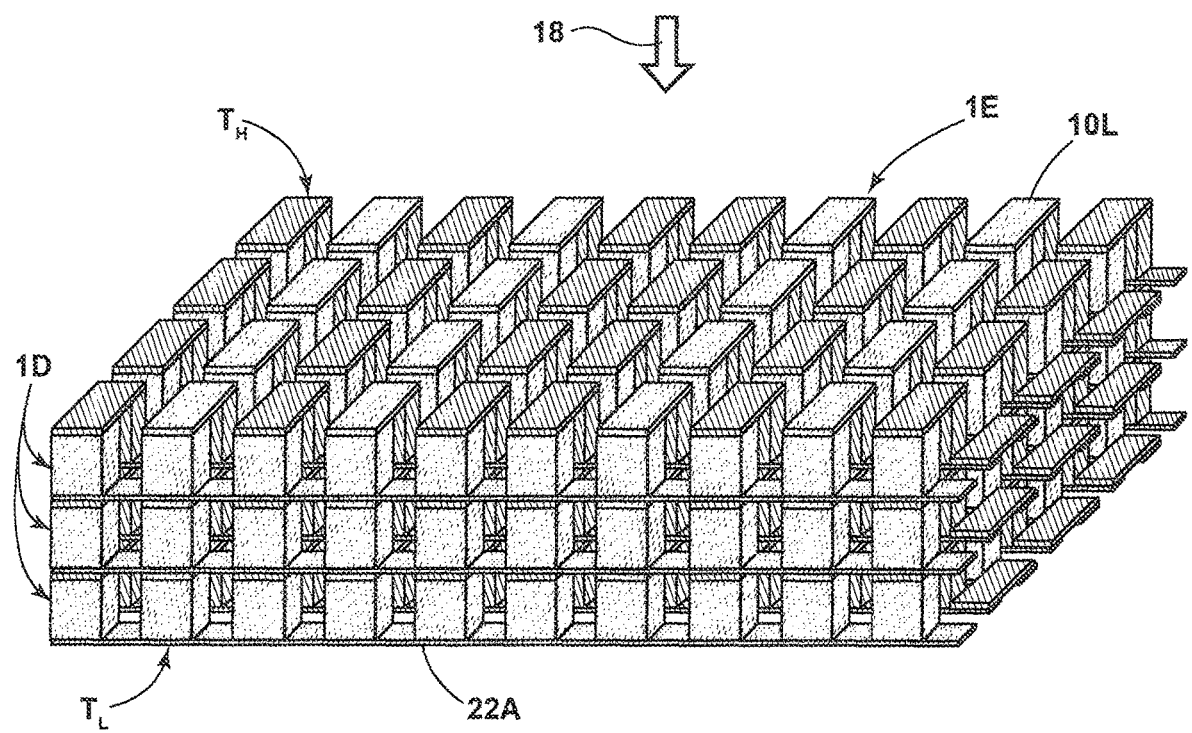
FIG. 4D is a partially schematic isometric view showing a plurality of thermoelectric elements that are arranged to form a thermoelectric device having a plurality of layers, wherein each layer includes a plurality of thermoelectric elements.

As discussed in more detail below in connection with FIG. 5, a thermoelectric device according to the present disclosure may be fabricated utilizing thin film microfabrication processes. An in-plane array structure may be fabricated utilizing a micro-fabrication process, and an additional layer may be fabricated on top of the original layer to provide a tandem mode device 1E (FIG. 4D). The tandem (multi-layer) array structure of device 1E provides repeated regenerative cycles as the heat passes through the layers 1D to capture and convert more energy for high efficiency operation. By allowing a large amount of heat flux to pass through the layers 1D of thermoelectric materials, energetic electrons can easily cross the junction bridges due to potential disparity. Although a single thin film layer of thermoelectric materials may only capture a small portion of thermal energy for conversion to electrical power, the remaining thermal energy passes through the additional layers of the thin film structure of the thermoelectric device as a regenerative cycle. Because the energy goes through multiple layers of the thermoelectric device, a significant portion of the thermal energy is captured for regenerative conversion processes, and the device therefore generates a significant amount of electrical power with high efficiency.

A thermoelectric element according to the present disclosure may utilize a pair of metals, such as thermocouples, that can be selected such that the different metals include one with a high occupancy state and one with an unoccupied state. Examples of suitable material pairs are shown in Table 1.

degree of freedom. Otherwise, gainful degree of freedom by electrons within atomic domain requires relatively large amounts of energy. Accordingly, the availability and mobility of charges are implicitly determined by the occupancy state of elements and corresponding bandgap energy. The charges within a given domain frequently act as free electrons to freely and arbitrarily move around. However, a collective behavior is required to create electric potential. Electrons may be agitated by thermal waves which may be described as a vibratory mode of atoms or lattice oscillation to act in a somewhat unified or collective manner.

With reference to FIG. 1, a metal that develops high number of free electron population (negative potential lump) when it is heated may be regarded as a "negative" charge conductor. In contrast, metals with a high occupancy state may show the opposite characteristics (low number of free electron population), and may be regarded as a "positive" charge conductor. The gap between high and low population of free electrons develops a potential disparity where the side having a high free electron population appears negative and the side having a low free electron population appears positive.

The Seebeck coefficient is related to the potential behavior of collective charges under thermalization within a material. The Seebeck coefficient of a material is a measure of the magnitude of an induced thermoelectric voltage in response to a temperature difference across that material. FIG. 1 shows Seebeck coefficients for thermal couple materials K, E, J, and T (see also Table 1). As shown in FIG. 1, the Seebeck coefficient for thermocouple materials varies with temperature.

Figure 2:
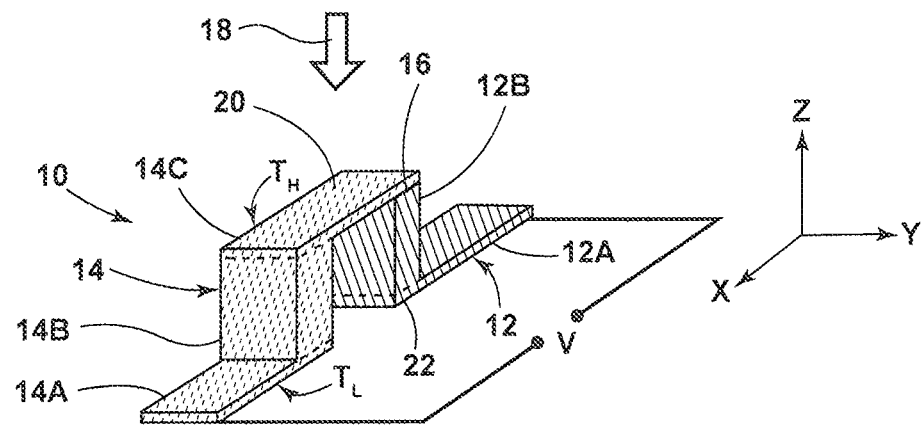
FIG. 2 is a partially schematic isometric view of a single thermoelectric element.

With further reference to FIG. 2, a single thermoelectric element 10 according to one aspect of the present invention includes a negative conductor 12 and a positive conductor 14. In FIG. 2, negative conductor 12 includes first and

TABLE 1

Thermocouple materials for metallic junction.

| Type | Positive Conductor | Negative Conductor | Sensitivity | Operating Temperature Range |
|---|---|---|---|---|
| K | Chromel | Alumel | 41 µV/° C. | −200° C. to 1350° C. |
| E | Chromel | Constantan | 68 µV/° C. | −250° C. to 900° C. |
| J | Iron | Constantan | 55 µV/° C. | −40° C. to 750° C. |
| N | Chromium | Nickel | 39 µV/° C. | up to 1200° C. |
| B | Platinum | Platinum/ 6% Rhodium | 10 µV/° C. | up to 1800° C. |
| R | Platinum | Platinum/ 13% Rhodium | 10 µV/° C. | up to 1600° C. |
| S | Platinum | Platinum/ 10% Rhodium | 10 µV/° C. | up to 1600° C. |
| T | Copper | Constantan | 43 µV/° C. | −200° C. to 350° C. |
| C | Tungsten- 5% thenium | Tungsten-26% rhenium | 30 µV/° C. | 0° C. to 2320° C. |
| M | Nickel- 18% Molybdenum | Nickel- 6% Cobalt | 30 µV/° C. | Up to 1400° C. |

In addition to the materials listed in Table 1, suitable pairs of materials can also be found, without limitation, from other transition metals which have a partially filled d-subshell and inner transition elements which have a partially filled f-subshell. Thus, a thermoelectric element according to the present disclosure may include a first metal having a partially filled d-subshell and a second metal (inner transition element) having a partially filled f-subshell.

Typically, d-block and f-block materials maintain unfilled states on their subshell structures that are places at which charge carriers keep their mobility with a certain level of second portions 12A and 12B, and positive conductor 14 includes three portions designated 14A, 14B, and 14C. It will be understood that the portions 12A and 12B may be a continuous, one piece structure, and the components 14A, 14B, and 14C may also comprise a unitary one-piece structure. The first surface shading of portions 12A and 12B is generally used in FIGS. 2, 3A, 3B, 4A, 4B, 4C, and 4D to designate a first metal material (negative conductor 12), and the second surface shading of portions 14A, 14B, 14C to designate a second metal material (positive conductor 14). The individual portions 14A, 14B, 14C, and the portions 12A, 12B may be fabricated utilizing a thin film deposition process (FIG. 5). However, the components 12A and 12B may, alternatively, comprise two different materials. For example, the portions 14A, 14B, and 14C may comprise more positive to less positive materials (i.e. three different materials), and 12B, 12A may comprise more negative to less negative materials (i.e. two different materials). The dashed lines of FIG. 2 may comprise interfaces between dissimilar materials. Alternatively, the dashed lines may represent the joints at which identical materials fuse to form a continuous one piece structure during the process of FIG. 5. Similarly, components 14A, 14B, and 14C could also comprise different materials. In general, the negative conductor 12 and the positive conductor 14 form a potential gap at interface 16 at which the conductors 12 and 14 are electrically interconnected. The potential gap at interface 16 is an important aspect because it drives electrons from high to low populated domains.

Referring again to FIG. 2, the portion 12B of negative conductor 12 generally extends in a first direction (i.e. direction Z in FIG. 2), and the portion 14B of positive conductor 14 also extends in the first direction. Accordingly, the portions 12B and 14B are disposed in parallel and simultaneously conduct thermal energy 18. The thermoelectric element 10 includes a first side 20 and a second side 22, such that thermal energy 18 applied to the thermoelectric element 10 flows from first side 20 to second side 22 (i.e. opposite the Z axis in FIG. 2). In use, the first side 20 is at a high temperature $T_H$, and second side 22 is at a lower temperature $T_L$. Due to the temperature difference between $T_H$ and $T_L$, a charge potential is developed between the material of negative conductor 12 and positive conductor 14. The charge potential causes a voltage V that may be utilized to provide electrical power. The charge difference between the conductors 12 and 14 is caused by the difference in the Seebeck coefficients of the two metallic junction materials at a given temperature difference.

The materials of the conductors 12 and 14 may be selected based on the highest possible value of each material's Seebeck coefficient at a given operational temperature. For example, if a metallic junction thermoelectric device 10 operates at 400° C., an E-type (Chromel-Constantan) material selections for conductors 12 and 14 will provide more power generation than T, J, or K materials. Specifically, with reference to FIG. 1, the E-type materials have a significantly higher Seebeck coefficient at 400° C. than the T, J, and K materials.

Figure 3A:
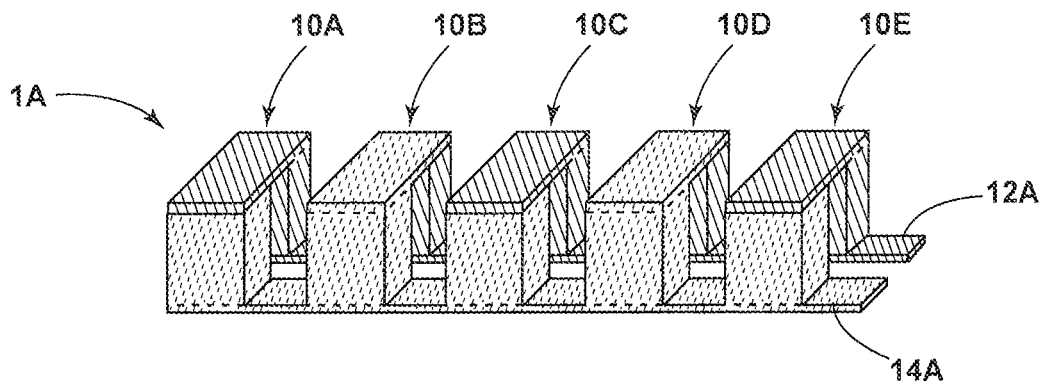
FIG. 3A is a partially schematic isometric view showing a plurality of thermoelectric elements that are arranged in a parallel mode connection.

With further reference to FIG. 3A, a plurality of thermoelectric elements 10A-10E may be interconnected in parallel by conductors 12A and 14A in a parallel mode connection. A parallel connection typically provides relatively high current and relatively low voltage.

Figure 3B:
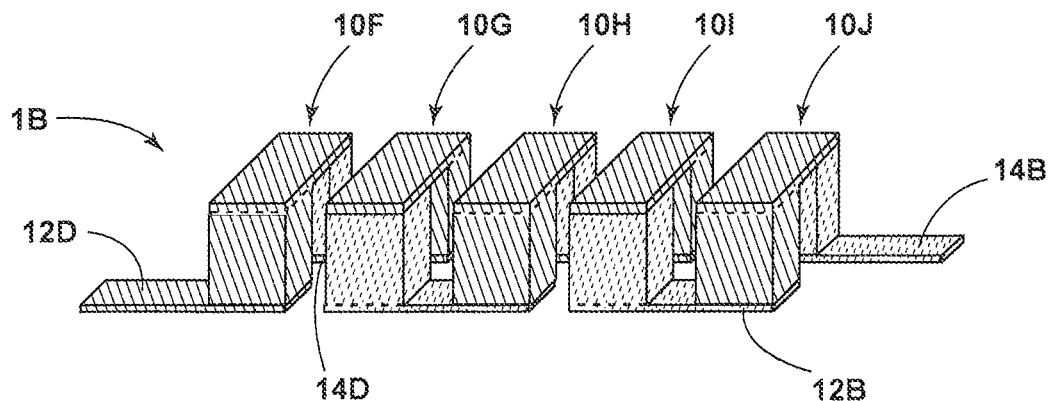
FIG. 3B is a partially schematic isometric view showing a plurality of thermoelectric elements that are arranged in a serial mode connection.

With further reference to FIG. 3B, a plurality of thermoelectric elements 10F-10J may be interconnected by conductors 14B-14D and conductors 12B-12D in a serial mode connection to form a thermoelectric device 1B. As shown in FIG. 4A, a very large number of individual thermoelectric elements 10A can be arranged in a layer and interconnected in a serial manner to form a thermoelectric device IC. With further reference to FIGS. 4B and 4C groups of thermoelectric elements 10I, can be connected in parallel to form groups 24A-24H. Adjacent groups 24A-24H can be interconnected in series by conductors 26A-26G to provide a mixed mode connection.

With further reference to FIG. 4D, a plurality of devices/layers 1D can be formed into a multi-layer device 1E. The device 1E may include a plurality of mixed mode devices 1D, or the device 1E may include a layer consisting solely of devices connected in a serial mode (FIG. 4A), or devices that are solely interconnected in a parallel mode (e.g. FIG. 3A).

In general, a thermoelectric device according to the present disclosure may include a single layer, 2 or more layers, or a very large number of layers, as required for a particular application. Furthermore, the configuration of the individual layers (i.e. parallel or serial mode connection) can be varied or adjusted as required to provide the required voltage and electrical current for a particular application. In general, the devices of FIGS. 2-4D may be subjected to thermal energy 18 at a high temperature side 20A. As the heat energy travels to the low temperature side 22A, the device 1E generates a voltage potential to thereby generate electric power that can be utilized to power electrical devices. Alternatively, the electrical power can be stored in a battery or other electrical source or device.

Figure 5:
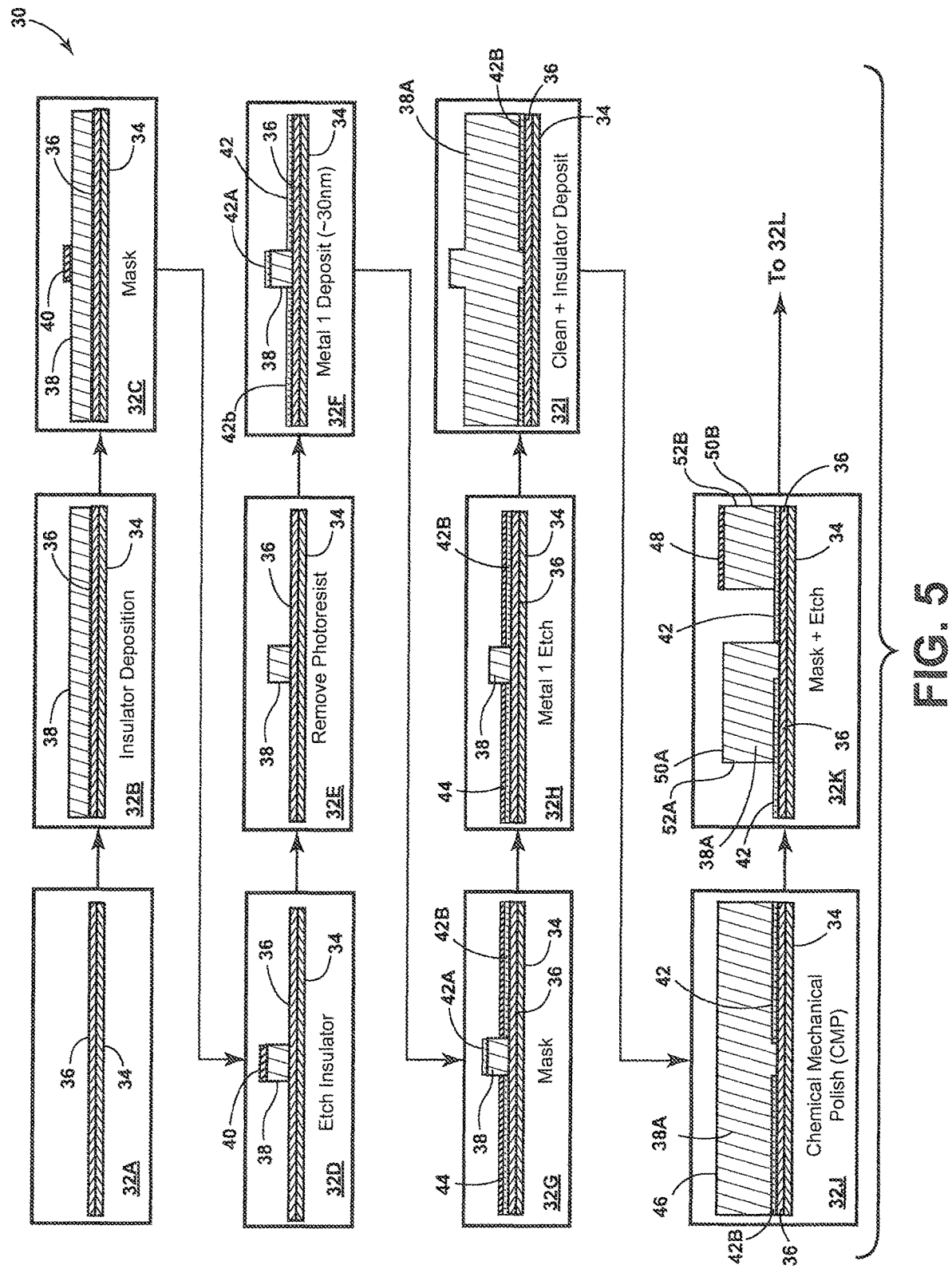
FIG. 5 is a schematic view showing a process that may be utilized to form one or more thermoelectric elements according to one aspect of the present disclosure.
Figure 5:
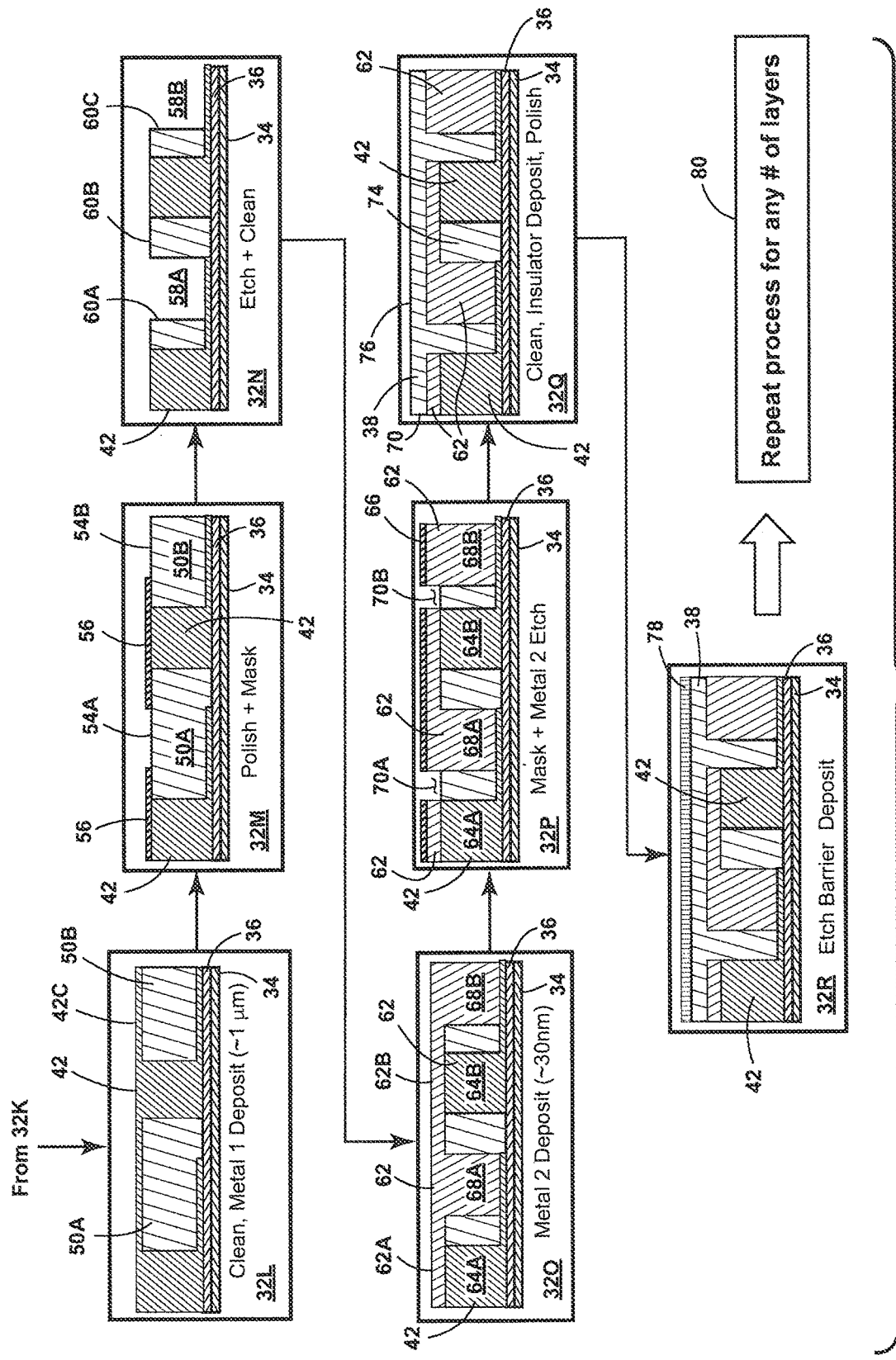

With further reference to FIG. 5, an etching process 30 including steps 32A-32R may be utilized to form a thermoelectric device 1 having one or more thermoelectric elements 10. Etching process 30 may begin by depositing a sacrificial layer 36 onto a substrate 34. As discussed in more detail below, following fabrication of a thermoelectric device, the sacrificial layer 36 may be dissolved to thereby remove the substrate 34 from the completed thermoelectric device. The substrate 34 may be made of a suitable material such as Si or SiC, and the sacrificial layer 36 may comprise a suitable material such as Si or $SiO_2$. At step 32B, an insulator 38 is deposited onto the sacrificial layer 36. The insulator 38 may comprise a suitable material having high electrical resistance and low thermal resistance such as diamond, $Si_3N_4$, $Al_2O_3$ or $SiO_2$, and it may be applied utilizing known deposition processes. Si is typically only used if the insulator 38 is to be removed in the final device to prevent electrical shorting that could occur due to the contribution of thermalized electrons by the Si. If insulator 38 is not removed, $SiO_2$ is preferred. At step 32C, a first mask 40 (photoresist) is positioned on the insulator 38, and the insulator is etched at step 32D utilizing known etching processes. It will be understood that the mask 40 is used to selectively expose the photoresist to UV light so that the resist in certain spots (such as 40) can be retained while the rest is removed. The first mask 40 is then removed at step 32E.

At 32F, a first metal 42 is deposited on the sacrificial layer 36 and insulator 38. The portion 42A of material 42 disposed on insulator 38 may have the same composition and thickness (approximately 30 nm) as the portion 42B of first metal 42 disposed on sacrificial layer 36. As shown at step 32G, a second mask 44 is then positioned over the portion 42B of first metal 42, leaving portion 42A of first metal 42 exposed. As shown at step 32H, an etching process is then used to remove the portion 42A of first metal 42 that was previously disposed on insulator 38. As shown at step 32I, the second portion of resist 44 is then removed, the portion 42B of first metal 42 and insulator 38 are then cleaned, and additional insulating material 38 is then deposited onto the portion 42B of first metal 42 and insulator 38. Insulating material 38A may have the same composition as insulating material 38, and the insulator 38 may fuse or mix with insulating material 38 to form a single, unitary insulating material 38A. As shown at step 32J, the insulating material 38A is then subject to a chemical mechanical polish (CMP) to provide a flat, polished surface 46 on insulating material 38A.

As shown at step 32K, a mask 48 is then applied to surface 46 of insulating material 38A, and the insulating material 38A is then etched to form individual blocks or portions 50A, 50B etc. of insulating material 38A. The etching process forms spaces 52A, 52B, etc. between the blocks 50A, 50B, etc. of insulating material 38A. The spaces 52A, 52B, etc. expose the first metal 42.

With further reference to step 32L, additional first metal 42 is then deposited (possibly after cleaning residue or debris from spaces 52A, 52B etc.) to form a uniform, one-piece metal deposit 42C. The blocks 50A, 50B, of insulating material 38A may be substantially encapsulated by the metal material 42.

With further reference to step 32M, a portion of the first metal 42C may be removed by polishing to provide exposed upper surfaces 54A, 54B, etc. of blocks 50A, 50B, etc. of insulating material 38A. A fourth photoresist application 56 is then positioned over the upper surfaces of metal 42 and blocks 50A, 50B, etc. of insulating material 38A. As shown at step 32N, an etching process is then utilized to remove portions of the insulating material 38 to form spaces 58, 58B, etc. between the remaining portions 60A, 60B, 60C of insulating material 38.

With further reference to step 32O, a second metal 62 is then deposited into spaces 58A, 58B, etc., and over the metal 42 and insulating material 38. The portions 62A, 62B, etc. of second metal 62 disposed over blocks 64A, 64B, etc. of first metal 42 may have a thickness on the order of about 10 µm. It will be understood that this is not an optimized height. It could be nanometers to microns tall. The components of the device could have any number of sizes and shapes. The second metal 62 forms blocks 68A, 68B, etc. that generally extend parallel to the blocks 64A, 64B, etc. of the first metal 42, with insulating material 38 disposed between the blocks of first metal 42 and second metal 62.

With further reference to step 32P, a fifth photoresist application 66 is then applied to the second metal 62, and an etching process is utilized to remove portions of the second metal 62, thereby forming spaces 70A, 70B etc. With reference to step 32Q, the mask 66 is then removed, and additional insulating material 38 is then deposited into spaces 70A, 70B, etc. and over the second metal 62. The insulating material 38 may melt/bond with the previously deposited insulating material 38 through the spaces 70A, 70B (step 32P), to thereby form a unitary, one-piece insulator 72. Portions 74 of insulating material 38 that are covered by second metal 62 may be bonded together outside of the plane of the drawings (i.e. out of plane at step 32P). It will be understood that the metal parts 64 and 68 do not extend across the width of the substrate. Metal parts 64 and 68 have a finite thickness into/out of the plane of the drawing. As such, the insulator 38 can bond to material that was previously deposited. This also permits selective etching of insulator 38 to form a vacuum or air gap between the metals 64 and 68. Also, insulator 38 cannot remain when barrier 78 is applied because it would preclude selectively etching away portions of the insulator 38.

Upper surface 76 of insulator 38 may be cleaned and polished at step 32Q to remove insulating material 38 down to the upper surface of metal 62. A barrier 78 may then be deposited over the insulating material 38 and exposed portions of metal 62 as shown at step 32R. The barrier 78 may comprise an electrically insulative, thermally conductive material such as diamond, SiC, or $Si_3N_4$. Barrier 78 may comprise $SiO_2$, but only if insulating material 38 is not $SiO_2$. Barrier 78 provides for electrical isolation of successive device layers while permitting thermal flow from the heat source to the cold sink. Barrier 78 may be chemically inert to the etchants used to remove insulator 38, and may be patterned to permit the chemical etchant to reach the insulative material 38 below barrier 78.

As shown at step 80 (FIG. 5), steps 32A-32R may be repeated as required to fabricate additional layers as may be required to form a multilayer structure (e.g. FIG. 4D). As discussed above, each layer may comprise a plurality of individual thermal elements 10 (FIG. 2) that may be arranged in a parallel mode (FIG. 3A) and/or a serial mode (FIG. 3B). As discussed above, parallel connections generally provide higher current and lower voltage, and serial connections provide lower current and higher voltage. Thus, a mixed mode of parallel and serial connections can be utilized to provide a desired or required power output. The overall power of a single unit or array as determined by various factors, such as (1) input thermal energy, (2) thermal mass of junction materials, (3) conversion factor by capturing thermal energy diffusing through junction materials, and (4) cross-sectional area of thermal energy diffusion. The input energy absorbed from an energy source is determined by the radiative property and thermal conductivity of materials. The absorptivity of front surface materials must be high. Also, the layer-to-layer contact must be sufficient to allow heat flux flow with minimal thermal resistivity.

The thicknesses, sizes, and shapes of the various components fabricated utilizing the process 30 of FIG. 5 may be varied as required for a particular thermoelectric element. For example, the thickness of each layer can be tailored to form a final panel thickness that will meet the thermoelectric panel performance and application dimensional requirements. The thicknesses may vary from a few nanometers to micrometers to a sub-millimeter level. If the insulative material 38 and the sacrificial layer 36 are removed, the devices become at least somewhat flexible (bendable) making them readily attachable to any device application area (e.g. a non-planar curved surface). Also, a thermoelectric panel according to the present disclosure may be fabricated on the back side of an electric device such as a CMOS chip to convert and control excessive heat into useful power. For example, a thin layer of electrically insulating material such as diamond, $Si_3N_4$ may be positioned (sandwiched) between the CMOS chip and the thermoelectric device to provide electrical insulation and thermal conductivity.

The thermal mass of the device structure also affects the use of the absorbed thermal energy. The mass of the insulator between the positive and negative conductors (i.e. first and second metals) may be minimized. If the insulator mass is not minimized, the insulator mass may retain thermal energy and disrupt the potential lump. Furthermore, excessive thermal mass may also conduct thermal energy around the junction of the two metals, reducing the amount of power converted into electricity. Specifically, the conversion factor is represented by the characteristics of the junction materials shown, for example, in Table 1. The sensitivity column in Table 1 represents the actual Seebeck coefficients of the listed thermoelectric materials. Providing a relatively large cross-sectional area of the two conductive materials permits conduction transfer of larger amounts of heat.

As discussed above, a thermoelectric device/element according to the present disclosure may be utilized to generate electrical power. However, a device according to the present disclosure may also be utilized for cooling purposes by applying electric power to the thermoelectric device/element. For example, with reference to FIG. 2, if electric power is applied to thermoelectric element 10, the thermoelectric element 10 provides cooling via the Peltier effect.

The thermoelectric element and thermoelectric devices of the present disclosure provide numerous advantages, and include various unique features. For example, the thermoelectric device and thermoelectric elements of the present disclosure utilize metallic junctions, not semiconductor junctions. Metals possess many more free, conducting electrons than semiconductors, and also have much higher carrier mobilities. The metallic junction design does not suffer from the drawback of conventional semiconductor thermoelectric devices which require the difficult combination of high electrical conductivity with low thermal conductivity to obtain maximum efficiency. The metal junction materials may have relatively high thermal conductivities, thereby providing for increased thermal flow through the junction materials. Furthermore, the thermoelectric element/device may be fabricated with a relatively large cross-sectional area of the metal conductors to provide for heat flow through the device/element. Furthermore, the thermoelectric device may comprise a thin-film structure with multiple layers of thermoelectric panels. This thin film structure may be mechanically flexible. The multiple layers of a thermoelectric panel form a tandem mode of regenerative cycle for energy conversion.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A metal junction thermoelectric device, comprising:
at least one thermoelectric element having first and second opposite sides and including:
a first conductor made from a first non-doped metal and including a first block;
a second conductor made from a second non-doped metal and including a second block disposed in parallel with the first block, wherein the first and second blocks are arranged to conduct heat in parallel between the first and second sides;
a portion made from one of the first non-doped metal and the second non-doped metal and extending between the first and second blocks to electrically interconnect the first and second blocks;
electrically insulative material disposed between the first and second conductors; and
wherein the first metal has a first occupancy state and the second metal has a second occupancy state that is lower than the first occupancy state such that a temperature difference between the first and second sides causes a charge potential and generates electrical power, and
wherein the first metal with the first higher occupancy state has a partially filled f-subshell, and wherein the first and second blocks are at least 10 times as thick as the respective portion.

2. The metal junction thermoelectric device of claim 1, wherein at least one of the first and second metals has a partially filled d-subshell.

3. The metal junction thermoelectric device of claim 1, wherein the first non-doped metal is selected from the group consisting of chromel alloy, iron, chromium, platinum, tungsten-rhenium alloy, and nickel-molybdenum alloy.

4. The metal junction thermoelectric device of claim 1, wherein the second non-doped metal is selected from the group consisting of alumel alloy, constantan alloy, nickel, platinum-rhodium alloy, tungsten-rhenium alloy, and nickel-cobalt alloy.

5. The metal junction thermoelectric device of claim 1, further comprising:
a plurality of thermoelectric elements connected in parallel, wherein each thermoelectric element includes a first conductor made from the first non-doped metal, and a second conductor made from the second non-doped metal.

6. The metal junction thermoelectric device of claim 1, further comprising:
a plurality of thermoelectric elements connected in series, wherein each thermoelectric element includes a first conductor made from the first non-doped metal, and a second conductor made from the second non-doped metal.

7. The metal junction thermoelectric device of claim 1, further comprising:
a plurality of thermoelectric elements connected in parallel; and
a plurality of thermoelectric elements connected in series to form a mixed mode device.

8. The metal junction thermoelectric device of claim 1, further comprising:

a plurality of the at least one thermoelectric elements, each of the plurality of thermoelectric elements having first and second opposite sides and including:

a respective first conductor made from the first non-doped metal and including a respective first block;

a respective second conductor made from the second non-doped metal and including a respective second block disposed in parallel with the respective first block, wherein the respective first and second blocks of the thermoelectric element are arranged to conduct heat in parallel between the first and second sides; and a respective portion made from one of the first non-doped metal and the second non-doped metal and extending between the respective first and second blocks to electrically interconnect the first and second blocks;

wherein one or more of the plurality of thermoelectric elements have the respective portion made from the first non-doped metal, and one or more of the plurality of thermoelectric elements have the respective portion made from the second non-doped metal.

9. A metal junction thermoelectric device, comprising:

a plurality of thermoelectric elements, wherein the plurality of thermoelectric elements are arranged in a varied series along a line of alternating first and second thermoelectric elements, the first thermoelectric element defining an odd position in the series and the second thermoelectric element defining an even position in the series, wherein each of the plurality of thermoelectric elements has first and second opposite sides and including:

a respective first conductor made from a first non-doped metal and including a respective first block;

a respective second conductor made from a second non-doped metal and including a respective second block disposed in parallel with the respective first block, wherein the respective first and second blocks of the thermoelectric element are arranged to conduct heat in parallel between the first and second sides;

a respective portion made from one of the first non-doped metal and the second non-doped metal and extending between the respective first and second blocks to electrically interconnect the first and second blocks, wherein the first and second blocks are at least 10 times as thick as the respective portion;

wherein the first non-doped metal has a first occupancy state and the second non-doped metal has a second occupancy state that is lower than the first occupancy state such that a temperature difference between the first and second sides causes a charge potential and generates electrical power;

wherein one or more of the plurality of thermoelectric elements have the respective portion made from the first non-doped metal, and one or more of the plurality of thermoelectric elements have the respective portion made from the second non-doped metal;

wherein the thermoelectric elements at even numbered positions have the respective portion made from the first non-doped metal;

wherein the thermoelectric elements at odd numbered positions have the respective portion made from the second non-doped metal;

wherein the first non-doped metal with the first higher occupancy state has a partially filled f-subshell and the second non-doped metal with the second lower occupancy state has a partially filled d-subshell;

wherein the first non-doped metal and the dissimilar second non-doped metal do not form a p-n junction.

10. The metal junction thermoelectric device of claim 9, wherein the plurality of thermoelectric elements are arranged to form a multi-layer structure with the respective thermoelectric elements of each layer formed into a connected array.

11. The metal junction thermoelectric device of claim 9, wherein the first and second blocks are fabricated by a thin film deposition microfabrication process.

* * * * *